(12) United States Patent
Nishisaka et al.

(10) Patent No.: US 9,148,954 B2
(45) Date of Patent: Sep. 29, 2015

(54) CERAMIC ELECTRONIC COMPONENT AND WIRING BOARD HAVING BUILT-IN CERAMIC ELECTRONIC COMPONENT

(71) Applicant: Murata Manufacturing Co., Ltd., Nagaokakyo-shi, Kyoto-fu (JP)

(72) Inventors: Yasuhiro Nishisaka, Nagaokakyo (JP); Satoshi Matsuno, Nagaokakyo (JP); Akihiro Yoshida, Nagaokakyo (JP); Yasunori Taseda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 44 days.

(21) Appl. No.: 14/223,258

(22) Filed: Mar. 24, 2014

(65) Prior Publication Data

US 2014/0291000 A1 Oct. 2, 2014

(30) Foreign Application Priority Data

Mar. 26, 2013 (JP) ................................. 2013-063356
Jan. 29, 2014 (JP) ................................. 2014-014684

(51) Int. Cl.
*H05K 1/03* (2006.01)
*H05K 1/18* (2006.01)
*H01G 4/232* (2006.01)

(52) U.S. Cl.
CPC ........... *H05K 1/0306* (2013.01); *H01G 4/2325* (2013.01); *H05K 1/185* (2013.01); *H05K 2201/10636* (2013.01); *H05K 2203/107* (2013.01); *H05K 2203/1469* (2013.01)

(58) Field of Classification Search
CPC .................................................... H05K 1/0306
See application file for complete search history.

(56) References Cited

U.S. PATENT DOCUMENTS

| | | |
|---|---|---|
| 2009/0284896 A1 | 11/2009 | Sakaguchi et al. |
| 2010/0123994 A1 | 5/2010 | Nishisaka et al. |
| 2011/0290542 A1 | 12/2011 | Nishisaka et al. |
| 2012/0018204 A1 | 1/2012 | Sato et al. |
| 2012/0019099 A1 | 1/2012 | Sato et al. |

FOREIGN PATENT DOCUMENTS

| | | |
|---|---|---|
| JP | 2002-100875 A | 4/2002 |
| JP | 2008-205073 A | 9/2008 |
| JP | 2009-253010 A | 10/2009 |
| JP | 2010-141300 A | 6/2010 |
| JP | 2012-009813 A | 1/2012 |
| JP | 2012-028457 A | 2/2012 |
| JP | 2012-028458 A | 2/2012 |

*Primary Examiner* — Jeremy C Norris
(74) *Attorney, Agent, or Firm* — Keating & Bennett, LLP

(57) ABSTRACT

A ceramic electronic component includes a ceramic body and an outer electrode. The ceramic body includes first and second principal surfaces, first and second lateral surfaces, and first and second end surfaces. The outer electrode is provided on the first principal surface. The outer electrode includes an underlying electrode layer containing Cu and glass, and a Cu plating layer. The underlying electrode layer is disposed on the first principal surface. The Cu plating layer is disposed on the underlying electrode layer. The Cu plating layer is thicker than the underlying electrode layer.

19 Claims, 6 Drawing Sheets

CERAMIC ELECTRONIC COMPONENT AND WIRING BOARD HAVING BUILT-IN CERAMIC ELECTRONIC COMPONENT

BACKGROUND OF THE INVENTION

1. Field of the Invention

The present invention relates to a ceramic electronic component and a wiring board including a built-in ceramic electronic component including the same.

2. Description of the Related Art

In recent years, with the reduction in the size and thickness of electronic devices, such as cellular phones and portable music players, a reduction in the size and thickness of wiring boards which are installed in such electronic devices has also been advancing.

Japanese Unexamined Patent Application Publication No. 2002-100875 proposes a method for reducing the thickness of a wiring board, in which a ceramic electronic component is embedded in a wiring board, and an interconnect line to the ceramic electronic component is formed by a via-hole electrode disposed on the ceramic electronic component. In this method, it is not necessary to secure a region in which a ceramic electronic component is disposed on the surface of a wiring board, and also it is not necessary to secure a region in which an interconnect line to the ceramic electronic component is provided separately from a region in which the ceramic electronic component is provided. Consequently, it is possible to reduce the size of a wiring board having a built-in component.

As described in Japanese Unexamined Patent Application Publication No. 2002-100875, the via-hole electrode is formed by Cu plating in many cases. Therefore, in view of improving connectivity between the via-hole electrode and an outer electrode of the ceramic electronic component, the outermost layer of the outer electrode is preferably composed of Cu.

In general, a via-hole electrode is provided in a via hole which is formed by irradiation with a laser, such as a $CO_2$ laser, toward a position at which an outer electrode of a ceramic electronic component is located in a wiring board. There is a possibility that the outer electrode will be melted by being heated during laser irradiation.

In particular, in a thin ceramic electronic component in which a thin outer electrode is provided in order to reduce the thickness of a wiring board, the problem of melting of the outer electrode during laser irradiation is likely to occur.

SUMMARY OF THE INVENTION

Accordingly, preferred embodiments of the present invention provide a ceramic electronic component having excellent laser resistance.

According to a preferred embodiment of the present invention, a ceramic electronic component includes a ceramic body and an outer electrode. The ceramic body includes first and second principal surfaces, first and second lateral surfaces, and first and second end surfaces. The first and second principal surfaces extend in the length direction and the width direction. The first and second lateral surfaces extend in the length direction and the thickness direction. The first and second end surfaces extend in the width direction and the thickness direction. The outer electrode is provided on the first principal surface. The outer electrode includes an underlying electrode layer including Cu and glass, and a Cu plating layer. The underlying electrode layer is disposed on the first principal surface. The Cu plating layer is disposed on the underlying electrode layer. The Cu plating layer is thicker than the underlying electrode layer.

In a specific aspect of the ceramic electronic component according to a preferred embodiment of the present invention, the thickness of the Cu plating layer preferably is about 1.5 times or more the thickness of the underlying electrode layer, for example.

In another specific aspect of the ceramic electronic component according to a preferred embodiment of the present invention, the ceramic electronic component further includes an inner electrode. The inner electrode is exposed at a surface of the ceramic body. The inner electrode is electrically connected to the outer electrode. The underlying electrode layer includes a glass medium and a plurality of Cu particles. The plurality of Cu particles are disposed in the glass medium. The plurality of Cu particles define a conduction path electrically connecting the inner electrode and the Cu plating layer to each other.

In another specific aspect of the ceramic electronic component according to a preferred embodiment of the present invention, the plurality of Cu particles include elongated Cu particles.

In another specific aspect of the ceramic electronic component according to a preferred embodiment of the present invention, the glass content in the underlying electrode layer preferably is about 35% by volume or more.

In another specific aspect of the ceramic electronic component according to a preferred embodiment of the present invention, the thickness of the outer electrode preferably is about 15 μm or less, for example.

According to various preferred embodiments of the present invention, a wiring board including a built-in ceramic electronic component includes the ceramic electronic component described above and a wiring board. The ceramic electronic component is embedded in the wiring board. The wiring board includes an electrode pad which is provided on a principal surface thereof and opposed to the outer electrode, and a via-hole electrode which electrically connects the electrode pad and the outer electrode to each other.

According to various preferred embodiments of the present invention, it is possible to provide a ceramic electronic component having excellent laser resistance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
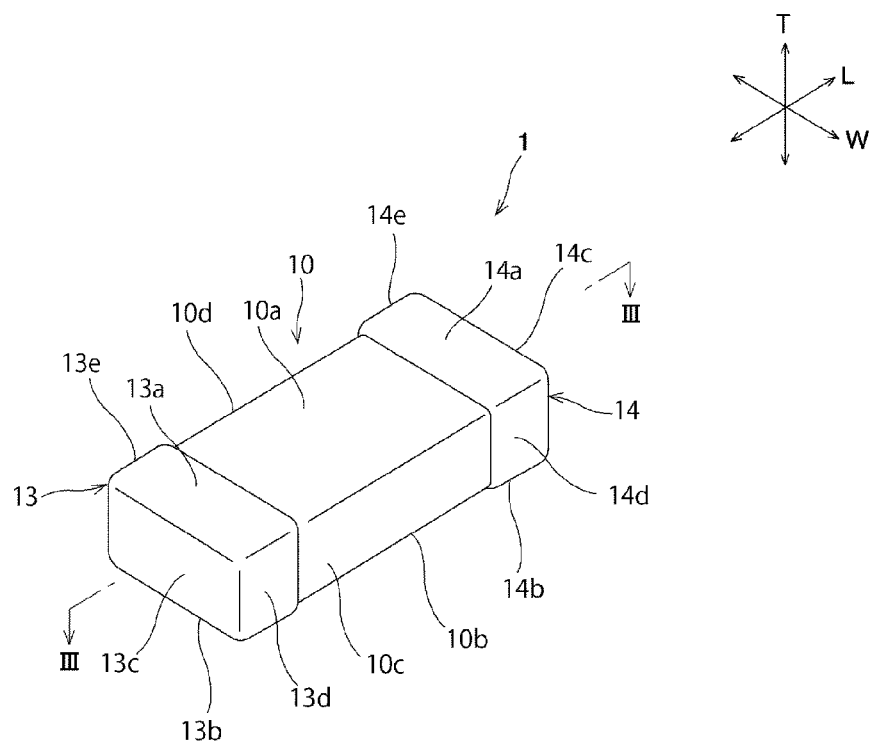
FIG. 1 is a schematic perspective view of a ceramic electronic component according to a preferred embodiment of the present invention.

Examples of preferred embodiments of the present invention will be described below. However, the preferred embodiments described below are merely examples. The present invention is not limited to the preferred embodiments described below.

Furthermore, in the drawings referenced in the preferred embodiments and the like, members having substantially the same function are denoted by the same symbols. Furthermore, the drawings referenced in the preferred embodiments and the like are schematically described. Therefore, the ratio of dimensions and the like of objects illustrated in the drawings may be different from the ratio of dimensions and the like of actual objects. The ratio of dimensions and the like of objects may differ between the drawings in some cases. A specific ratio of dimensions and the like of objects should be determined by taking the following description into consideration.

Figure 2:
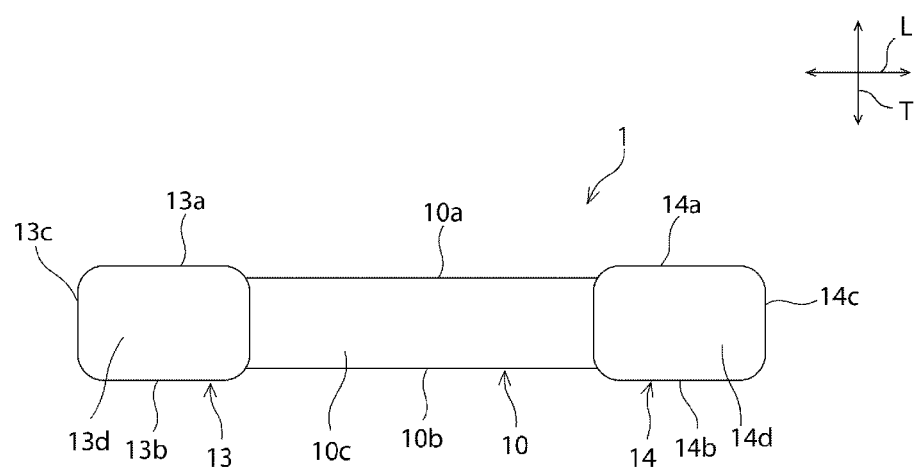
FIG. 2 is a schematic side view of the ceramic electronic component according to a preferred embodiment of the present invention.
Figure 3:
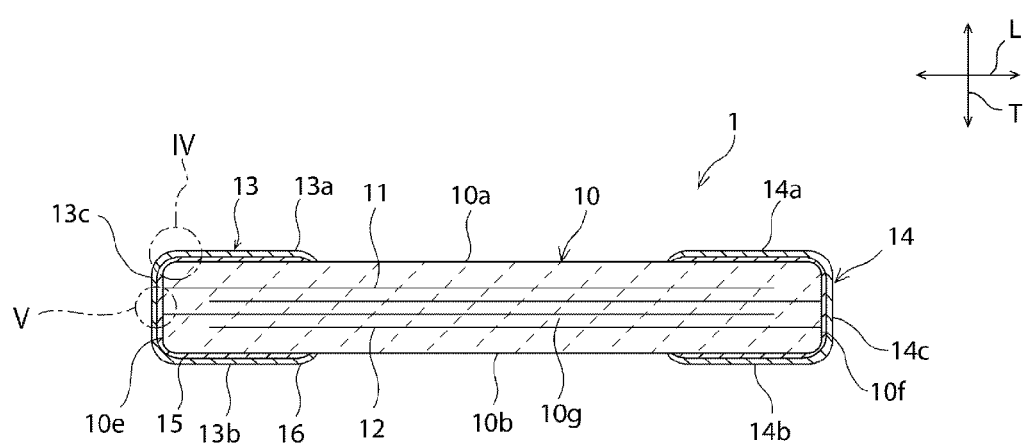
FIG. 3 is a schematic sectional view taken along the line III-III of FIG. 1.

As shown in FIGS. 1 to 3, a ceramic electronic component 1 includes a ceramic body 10. The ceramic body 10 is preferably made of an appropriate ceramic material according to the function of the ceramic electronic component 1. Specifically, in the case where the ceramic electronic component 1 is a capacitor, the ceramic body 10 can be composed of a dielectric ceramic material. Specific examples of the dielectric ceramic material include $BaTiO_3$, $CaTiO_3$, $SrTiO_3$, and $CaZrO_3$. Furthermore, in the case where the ceramic body 10 contains a dielectric ceramic material, the ceramic body 10 may contain the ceramic material as a main component, and a secondary component, such as a Mn compound, a Mg compound, a Si compound, an Fe compound, a Cr compound, a Co compound, a Ni compound, or a rare-earth compound, may be appropriately added thereto according to the desired characteristics of the ceramic electronic component 1.

In this preferred embodiment, the ceramic body 10 preferably has a rectangular or substantially rectangular parallelepiped shape. The term "rectangular parallelepiped shape" includes a parallelepiped shape with corners and edges being rounded. The ceramic body 10 includes a first principal surface 10a, a second principal surface 10b, a first lateral surface 10c, a second lateral surface 10d (refer to FIG. 1), a first end surface 10e, and a second end surface 10f (refer to FIG. 3). The first and second principal surfaces 10a and 10b each extend in the length direction L and the width direction W. The first and second lateral surfaces 10c and 10d each extend in the length direction L and the thickness direction T. The first and second end surfaces 10e and 10f each extend in the width direction W and the thickness direction T.

The dimensions of the ceramic body 10 are not particularly limited. However, the ceramic body 10 is effective when it is a thin type that satisfies the expression $D_T<D_W<D_L$, $(1/5)D_W \leq D_T \leq (1/2)D_W$, or $D_T<0.3$ mm, where $D_T$ is the thickness, $D_L$ is the length, and $D_W$ is the width of the ceramic body 10, for example. Specifically, the ceramic body 10 is effective when $0.05$ mm $\leq D_T < 0.3$ mm, $0.4$ mm $\leq D_L \leq 1$ mm, and $0.3$ mm $\leq D_W \leq 0.5$ mm, for example.

As shown in FIG. 3, a plurality of first and second inner electrodes 11 and 12, which preferably are rectangular or substantially rectangular, are provided in the ceramic body 10. The first inner electrodes 11 are exposed at the first end surface 10e, and are not exposed at the second end surface 10f and the first and second lateral surfaces 10c and 10d. On the other hand, the second inner electrodes 12 are exposed at the second end surface 10f, and are not exposed at the first end surface 10e and the first and second lateral surfaces 10c and 10d. The first inner electrodes 11 and the second inner electrodes 12 are alternately disposed in the thickness direction T with a distance therebetween. The thickness of a ceramic portion 10g provided between the adjacent first and second inner electrodes 11 and 12 may preferably be set, for example, to be about 0.5 μm to about 10 μm. The thickness of each of the first and second inner electrodes 11 and 12 may preferably be set, for example, to be about 0.2 μm to about 2 μm.

The first and second inner electrodes 11 and 12 are preferably made of an appropriate conductive material. The first and second inner electrodes 11 and 12 can be, for example, composed of a metal, such as Ni, Cu, Ag, Pd, or Au, or an alloy containing one of these metals, such as an Ag—Pd alloy.

First and second outer electrodes 13 and 14 are disposed on the ceramic body 10. The first and second outer electrodes 13 and 14 are each disposed at least on the first principal surface 10a of the ceramic body 10. Specifically, in this preferred embodiment, the first outer electrode 13 is arranged so as to extend over the first end surface 10e to the first and second principal surfaces 10a and 10b and to the first and second lateral surfaces 10c and 10d. That is, the first outer electrode 13 includes a first portion 13a disposed on the first principal surface 10a, a second portion 13b disposed on the second principal surface 10b, a third portion 13c disposed on the first end surface 10e, a fourth portion 13d disposed on the first lateral surface 10c, and a fifth portion 13e disposed on the second lateral surface 10d. The first outer electrode 13 is electrically connected to the first inner electrodes 11 at the third portion 13c.

The second outer electrode 14 preferably extends over the second end surface 10f to the first and second principal surfaces 10a and 10b and to the first and second lateral surfaces 10c and 10d. That is, the second outer electrode 14 includes a first portion 14a disposed on the first principal surface 10a, a second portion 14b disposed on the second principal surface 10b, a third portion 14c disposed on the second end surface 10f, a fourth portion 14d disposed on the first lateral surface 10c, and a fifth portion 14e disposed on the second lateral surface 10d. The second outer electrode 14 is electrically connected to the second inner electrodes 12 at the third portion 14c.

In various preferred embodiments of the present invention, it is preferable for the first and second outer electrodes to be disposed on the first principal surface, but it is not always necessary for the first and second outer electrodes to be disposed on the second principal surface, the first and second lateral surfaces, and the first and second end surfaces.

From the viewpoint of reducing the thickness of the ceramic electronic component 1, the thickness of each of the first portions 13a and 14a of the first and second outer electrodes 13 and 14 located on the first principal surface 10a is preferably about 15 μm or less, and more preferably about 10 μm or less, for example. However, when the first and second outer electrodes 13 and 14 are excessively thin, it is difficult to form the first and second outer electrodes 13 and 14. Therefore, the thickness of each of the first portions 13a and 14a of the first and second outer electrodes 13 and 14 located on the first principal surface 10a is preferably about 6 μm or more, for example.

Figure 4:
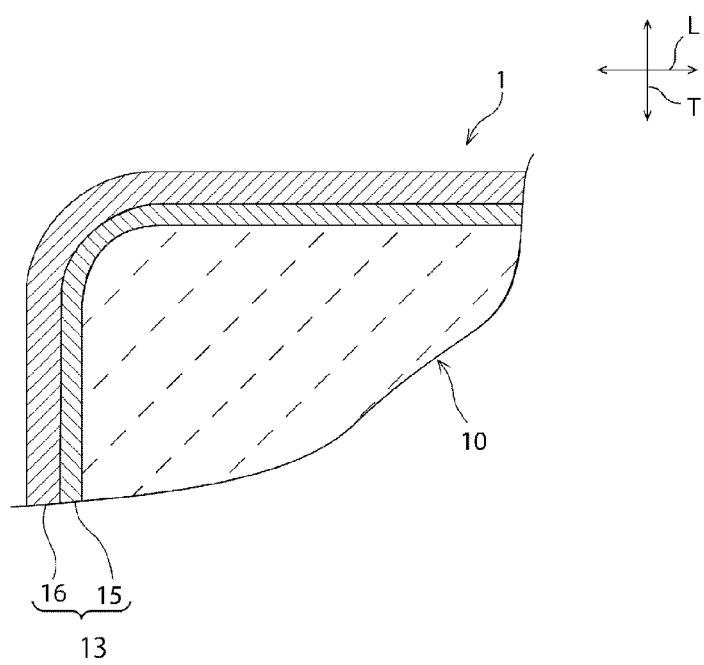
FIG. 4 is an enlarged schematic sectional view of a portion surrounded by the line IV of FIG. 3.

As shown in FIGS. 3 and 4, each of the first and second outer electrodes 13 and 14 includes an underlying electrode layer 15 and a Cu plating layer 16. In this preferred embodiment, each of the first and second outer electrodes 13 and 14 includes the underlying electrode layer 15 and the Cu plating layer 16.

Figure 5:
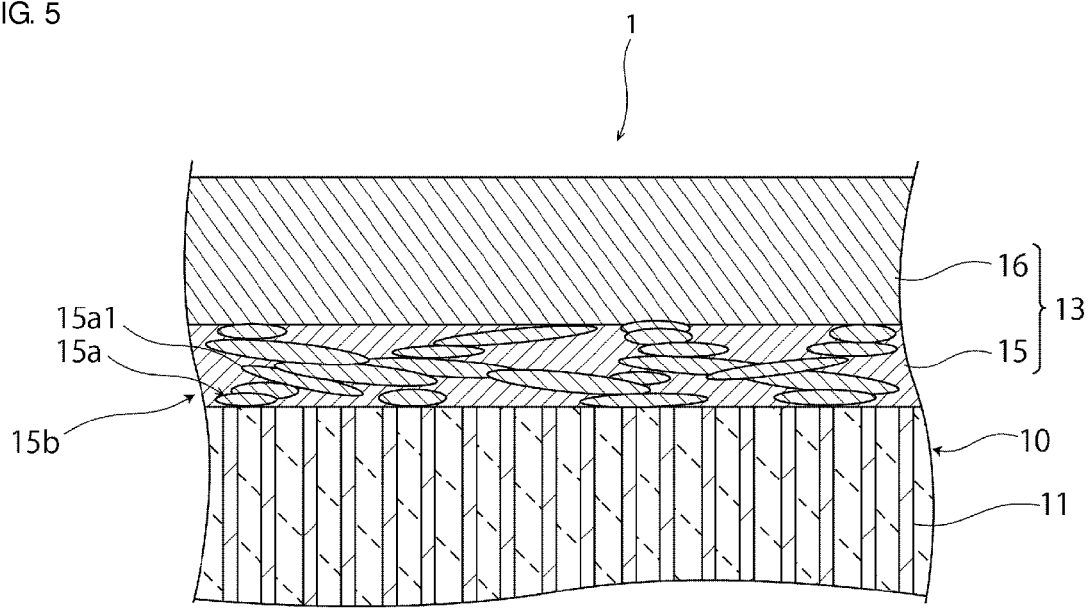
FIG. 5 is an enlarged schematic sectional view of a portion surrounded by the line V of FIG. 3.

The underlying electrode layer 15 is disposed on the ceramic body 10. Preferably, the underlying electrode layer 15 preferably includes Cu and glass. In this preferred embodiment, since the underlying electrode layer 15 contains glass, it can be referred to as the glass-containing underlying electrode layer. Specifically, as shown in FIG. 5, the underlying electrode layer 15 contains a glass medium 15b and a plurality of Cu particles 15a. Note that Cu contained in the underlying electrode layer 15 may be sintered and integrated, instead of being particulate.

In a preferred embodiment of the present invention, by providing the underlying electrode layer 15, it is possible to improve the adhesion strength between the ceramic body 10 and each of the outer electrodes 13 and 14. The reason for this is as follows.

In the case where the Cu plating layer 16 is directly formed on the ceramic body 10 without providing the underlying electrode layer 15, at the end surface portions of the ceramic body 10 at which the inner electrodes 11 and 12 are exposed, the Cu plating layer 16 is formed using the metal of the inner electrodes 11 or 12 as a starting point. Consequently, the ceramic body 10 and the Cu plating layer 16 are bonded to each other. However, at the upper and lower lateral surface portions at which the inner electrodes 11 and 12 are not exposed, it is difficult to obtain adhesion between the Cu plating layer 16 and the ceramic body 10. In the preferred embodiments of the present invention, by forming the underlying electrode layer 15 containing Cu and glass, the glass functions as a binder. This improves the adhesion strength between the ceramic body 10 and the underlying electrode layer 15, and furthermore, facilitates the formation of the Cu plating layer 16 using the Cu of the underlying electrode layer 15 as a starting point. Therefore, the Cu plating layer 16 is reliably and stably formed, and the adhesion strength between the ceramic body 10 and each of the outer electrodes 13 and 14 are improved.

The content of the glass medium 15b in the underlying electrode layer 15 is preferably about 35% to about 75% by volume, and more preferably about 35% to about 50% by volume, for example. When the content of the glass medium 15b in the underlying electrode layer 15 is excessively low, the moisture resistance of the ceramic electronic component 1 may be degraded in some cases. When the content of the glass medium 15b in the underlying electrode layer 15 is excessively high, it may become difficult to form the Cu plating layer 16 and it may become difficult to securely electrically connect the Cu plating layer 16 to the inner electrodes 11 or 12 in some cases. An underlying electrode layer with a high glass content may be referred to as the glass coat layer.

Furthermore, the ratio between the Cu particles 15a and the glass medium 15b contained in the underlying electrode layer 15 can be measured in the following manner. The LT surface of the ceramic electronic component 1 is subjected to cross-sectioning to the center in the W direction, and in the resulting cross section, the underlying electrode layer 15 in the center of one end surface is observed with an SEM. Next, in the SEM image (magnification: 5,000 times, accelerating voltage: 15 kV), a line (length 30 μm) perpendicular to the inner electrode is drawn at a position corresponding to ½ of the thickness of the underlying electrode layer 15, and the length of the metal portion and the length of the glass portion located on the line are measured. The ratio between the length of the metal portion and the length of the glass portion is defined as the ratio between the Cu particles 15a and the glass medium 15b contained in the underlying electrode layer 15.

Preferably, the glass medium 15b contains, for example, at least one network former oxide selected from the group consisting of $B_2O_3$ and $SiO_2$ and at least one network modifier oxide selected from the group consisting of $Al_2O_3$, ZnO, CuO, $Li_2O$, $Na_2O$, $K_2O$, MgO, CaO, BaO, $ZrO_2$, and $TiO_2$. Preferably, the glass medium 15b contains about 35 mol % or more of $SiO_2$, for example.

The plurality of Cu particles 15a are disposed in the glass medium 15b. The plurality of Cu particles 15a define conduction paths which electrically connect the Cu plating layer 16 to the inner electrode 11 or 12. The conduction paths are defined by adjacent Cu particles 15a being in contact with each other.

Preferably, the plurality of Cu particles 15a include elongated Cu particles 15a1.

The elongated Cu particles 15a1 may be, for example, flat, flaky, acicular, or rod-shaped.

The average particle size of the Cu particles 15a1 is preferably about 0.5 μm to about 10 μm, for example. In the present invention, the average particle size of metal powder refers to the particle size at 50% cumulative value in the particle size distribution obtained by the laser diffraction/scattering method.

The content of the Cu particles 15a in the underlying electrode layer 15 is preferably about 25% to about 65% by volume, and more preferably about 50% to about 60% by volume, for example.

The thickness of the underlying electrode layer 15 in a portion located on the first principal surface 10a is preferably about 1 μm to about 10 μm, for example. When the thickness of the underlying electrode layer 15 is excessively small, the moisture resistance of the ceramic electronic component 1 may become excessively low in some cases. When the thickness of the underlying electrode layer 15 is excessively large, the thickness of the ceramic electronic component 1 may become excessively large in some cases. Furthermore, when the thickness of the underlying electrode layer 15 is excessively large, the absolute amount of glass contained in the underlying electrode layer 15 increases. Therefore, the component constituting the inner electrodes 11 and 12 is likely to be diffused in liquid phase into the melt of the glass contained in the underlying electrode layer 15. Consequently, the tip portions of the inner electrodes 11 and 12 become thin, and a gap is likely to occur between each of the inner electrodes 11 and 12 and the underlying electrode layer 15. As a result, the moisture resistance of the ceramic electronic component 1 may be degraded in some cases.

The underlying electrode layer 15 can be formed by application of a glass paste containing glass powder, Cu particles 15a, a binder, a solvent, and the like, followed by baking. The baking temperature of the glass paste layer is preferably a temperature at which the Cu particles 15a are not sintered. Specifically, the baking temperature of the glass paste layer is preferably about 700° C. or lower, for example.

The Cu plating layer 16 is disposed on the underlying electrode layer 15. More specifically, the Cu plating layer 16 preferably is disposed directly on the underlying electrode layer 15. That is, the Cu plating layer 16 is in direct contact with the underlying electrode layer 15. The Cu plating layer 16 may be defined by a single Cu plating layer or may be defined by a multilayer body including a plurality of Cu plating layers.

A portion of the Cu plating layer 16 located on the first principal surface 10a is thicker than a portion of the underlying electrode layer 15 located on the first principal surface 10a. The thickness of the portion of the Cu plating layer 16 located on the first principal surface 10a is preferably about 1.5 times or more the thickness of the portion of the underlying electrode layer 15 located on the first principal surface 10a. The thickness of the portion of the Cu plating layer 16 located on the first principal surface 10a is preferably about 4 times or less the thickness of the portion of the underlying electrode layer 15 located on the first principal surface 10a, for example.

Specifically, the thickness of the portion of the underlying electrode layer 15 located on the first principal surface 10a is preferably about 1 µm to about 7 µm, and more preferably about 2 µm to about 4 µm, for example. When the thickness of the portion of the underlying electrode layer 15 located on the first principal surface 10a preferably is about 1 µm or less, the amount of glass serving as a binder may be insufficient, and it may not be possible to obtain sufficient adhesion with the ceramic body 10 in some cases. Furthermore, when the thickness of the portion of the underlying electrode layer 15 located on the first principal surface 10a is about 7 µm or more, the ratio of the underlying electrode layer 15 to the Cu plating layer 16 increases, which may result in degradation of thermal conductivity. Furthermore, since the flatness of the underlying electrode layer 15 decreases, when the ceramic electronic component 1 is embedded and mounted in a wiring board 20, connection reliability at via-hole electrodes 22a and 22b may be degraded in some cases.

The thickness of the portion of the Cu plating layer 16 located on the first principal surface 10a is preferably about 5 µm to about 10 µm, for example. When the thickness of the Cu plating layer 16 is about 5 µm or less, it may not be possible to form a uniform Cu plating layer 16 on the underlying electrode layer 15 which is a composite film of glass and Cu, and the variation in the thickness of the Cu plating layer 16 may be increased. As a result, the heat-dissipating property and thermal conductivity in the plane of the Cu plating layer 16 may be degraded, resulting in occurrence of portions in which laser resistance is markedly decreased. Note that when the thickness of the Cu plating layer 16 is increased, laser resistance is basically improved. However, in the ceramic electronic component 1 suitable for being embedded and mounted, since its thickness is small, the thickness of the Cu plating layer 16 is decreased as much as possible, and the thickness of the ceramic body 10 is increased. As a result, it is required to increase the strength of the ceramic body 10. When the thickness of the Cu plating layer 16 is set to be about 10 µm or more, the thickness of the ceramic electronic component 1 increases. By setting the thickness of the Cu plating layer 16 to be about 5 µm to about 10 µm, for example, it is possible to obtain a sufficient laser resistance effect while maintaining a small thickness. In this specification, the thickness is an average of 10 samples measured, for example.

The thickness of each of the portions of the Cu plating layer 16, the underlying electrode layer 15, and the outer electrodes 13 and 14 located on the first principal surface 10a is the thickness at the center in the length direction L of a portion located on the first principal surface in a cross section taken along the length direction L and the thickness direction T located at the center in the width direction W.

Furthermore, the surface of the Cu plating layer 16 may be roughened. Since the surface of the Cu plating layer 16 is roughened, at the time of embedding the ceramic electronic component 1 into a wiring board 20, the anchor effect of the Cu plating layer 16 to an interlayer insulating layer composed of a resin at the wall surface of the wiring board 20 is enhanced. Consequently, adhesion between the wiring board 20 and the ceramic electronic component 1 is improved.

Figure 6:
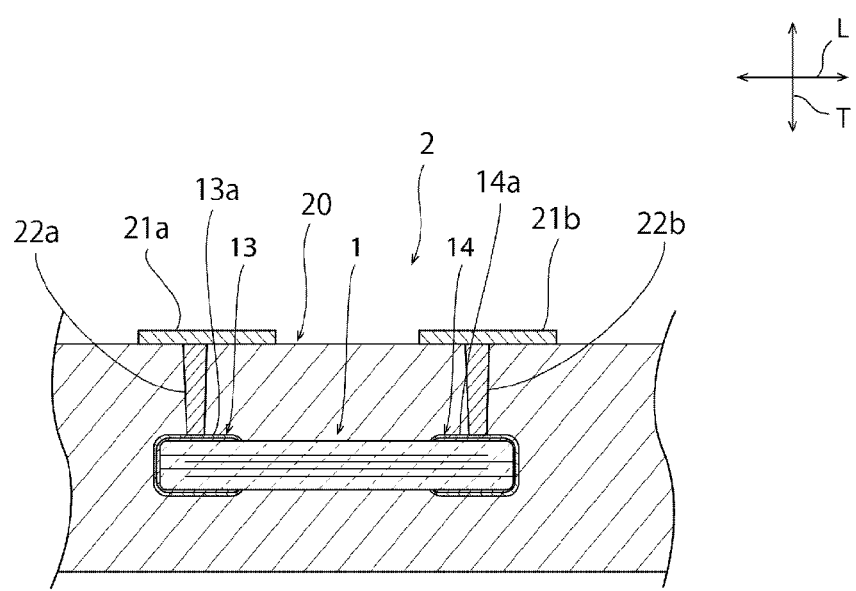
FIG. 6 is a schematic sectional view of a wiring board having a built-in ceramic electronic component according to a preferred embodiment of the present invention.

The ceramic electronic component 1 is suitably used, for example, in a wiring board including a built-in ceramic electronic component 2 shown in FIG. 6.

As shown in FIG. 6, the wiring board including a built-in ceramic electronic component 2 includes a wiring board 20. The ceramic electronic component 1 is embedded in the wiring board 20. Electrode pads 21a and 21b are disposed on a principal surface of the wiring board 20. The electrode pads 21a and 21b are opposed to the first portions 13a and 14a of the outer electrodes 13 and 14. The electrode pad 21a and 21b and the first portions 13a and 14a of the outer electrodes 13 and 14 are electrically connected to each other by via-hole electrodes 22a and 22b which extend in the thickness direction of the wiring board 20. The via-hole electrodes 22a and 22b are provided in via holes formed by laser irradiation toward the first portions 13a and 14a of the outer electrodes 13 and 14.

It takes a long time to form a thick plating layer. Therefore, generally, a plating layer is formed thinly and an underlying electrode layer is formed thickly. Since the underlying electrode layer 15 according to the preferred embodiments of the present invention contains not only metal but also glass, thermal conductivity is decreased compared with a plating layer which does not contain glass. In the case where a plating layer is formed thinly and an underlying electrode layer containing glass is formed thickly, the percentage of the underlying electrode layer having a low thermal conductivity is larger than that of the plating layer having a high thermal conductivity. Therefore, the thermal conductivity of the entire outer electrode is decreased. Consequently, the heat-dissipating property is degraded, and heat produced by laser irradiation is concentrated locally, which may result in melting of the outer electrode in some cases.

On the other hand, in the ceramic electronic component 1 according to a preferred embodiment of the present invention, the thickness of the portion of the Cu plating layer 16 located on the first principal surface 10a is larger than the thickness of the portion of the underlying electrode layer 15 located on the first principal surface 10a. For this reason, the percentage of the Cu plating layer 16 having a high thermal conductivity is larger than the percentage of the underlying electrode layer 15 having a low thermal conductivity, and therefore, the thermal conductivity of the entire outer electrodes 13 and 14 is increased. Since the amount of heat produced by laser irradiation is likely to be dispersed through the entire Cu plating layer 16, an excellent heat-dissipating property is achieved. Heat produced by laser irradiation is not concentrated locally and is dispersed through the entire outer electrodes 13 and 14. Consequently, the outer electrodes 13 and 14 are unlikely to be melted, and excellent laser resistance is achieved. From the viewpoint of achieving more excellent laser resistance, the thickness of the portion of the Cu plating layer 16 located on the first principal surface 10a is preferably about 1.5 times or more the thickness of the portion of the underlying electrode layer 15 located on the first principal surface 10a.

Furthermore, in the case where the underlying electrode layer 15 contains glass, the thermal conductivity of the underlying electrode layer 15 is decreased. In the ceramic electronic component 1, since the underlying electrode layer 15 contains Cu, the decrease in the thermal conductivity of the underlying electrode layer 15 due to incorporation of glass is suppressed. Therefore, the decrease in the thermal conductivity of the outer electrodes 13 and 14 is suppressed, and more excellent laser resistance is achieved.

Furthermore, in the ceramic electronic component 1 in which the first portions 13a and 14a of the first and second outer electrodes 13 and 14 are formed thinly in order to reduce the size, laser resistance tends to be deteriorated. Accordingly, the technique of the present preferred embodiment in which excellent laser resistance is obtained is particularly useful in the ceramic electronic component 1 in which the thickness of the portions of the first and second outer electrodes 13 and 14 located on the first principal surface 10a is about 15 µm or less, and furthermore about 10 µm or less, for example.

Moreover, by increasing the thickness of the portion of the Cu plating layer 16 located on the first principal surface 10a, the flatness of that portion is improved.

In the ceramic electronic component 1, since the underlying electrode layer 15 contains glass, even in the case where the underlying electrode layer 15 is formed thinly, adhesion strength between the underlying electrode layer 15 and the ceramic body is increased. That is, the ceramic electronic component 1 has both excellent laser resistance and excellent moisture resistance, and is a thin type. From the viewpoint of achieving more excellent moisture resistance, the glass content in the underlying electrode layer 15 is preferably about 35% by volume or more, for example.

Experimental Examples 1 to 4

Ceramic electronic components having substantially the same structure as that of the ceramic electronic component 1 were actually fabricated under the following conditions:
Dimensions of ceramic body (design value): 1.0 mm×0.5 mm×0.15 mm
Ceramic material: $BaTiO_3$
Thickness of ceramic portion (design value): 0.9 µm
Material of inner electrodes: Ni
Thickness of inner electrodes (design value): 0.6 µm
Total number of inner electrodes: 45
Firing conditions: Kept for 2 hours at 1,200° C.
Capacitance of ceramic electronic component (design value): 0.47 µF
Rated working voltage (design value) of ceramic electronic component: 6.3 V
Thickness of underlying electrode layer 15: as shown in Table 1
Conductive particles contained in underlying electrode layer 15: as shown in Table 1
Content of Cu particles in underlying electrode layer 15: 62.8% by volume
Content of glass in underlying electrode layer 15: 37.2% by volume
Ratio of Cu powder to glass powder in solid content in glass paste: 57.5% by volume/42.5% by volume (prepared ratio)
Glass in underlying electrode layer 15: borosilicate-based glass
Baking temperature of underlying electrode layer 15: 680° C.
Thickness of Cu plating layer 16: as shown in Table 1
(Laser Resistance Test)

A laser resistance test was carried out on the ceramic electronic components of Experimental Examples 1 to 4. The laser resistance test was carried out, using a $CO_2$ laser device (ML605GTX manufactured by Mitsubishi Electric Corporation), by the method described below.

First, one-shot irradiation of $CO_2$ laser with a pulse width of 16 µs and a frequency of 4,000 Hz was performed at an energy density of 3.5 mJ on each of the center in the length direction and the center in the width direction of the outer electrode located on the first principal surface of the ceramic electronic component. The pulse width of the irradiating $CO_2$ laser was increased in increments of 2 µs, and the pulse width at which a molten mark was formed on the surface of the electrode or breaking of the body occurred was defined as the magnitude of laser resistance value. Measurement was performed by the same method on five ceramic electronic components for each of Experimental Examples 1 to 4, and the average of the magnitudes of laser resistance value was obtained. Table 1 shows the results in terms of the ratio (normalized value) in which Experimental Example 4 was considered as 1.

In each of the samples obtained as described above, the thickness of the underlying electrode layer was measured in the following manner. Cross-sectioning was performed along the LT surface of the sample to the center (½ of the width) of the sample. Then, in the resulting cross section, the thickness of the underlying electrode layer at a position of ½ of length $l_1$ was measured by an optical microscope, where $l_1$ is the length of a portion of the underlying electrode layer of one outer electrode located on the first principal surface extending in the length direction L from the end surface of the ceramic body to the front edge of the underlying electrode layer. The thickness of the underlying electrode layer shown in Table 1 below is an average of 10 samples.

In each of the samples obtained as described above, the thickness of the Cu plating layer was measured in the following manner. The LT surface of the sample was subjected to cross-sectioning along the length direction L to the center (½ of the width) of the sample. Then, in the resulting cross section, the thickness of the Cu plating layer at a position of ½ of length $l_2$ was measured by an optical microscope, where $l_2$ is the length of a portion of the Cu plating layer of one outer electrode located on the first principal surface extending in the length direction L from the end surface of the ceramic body to the front edge of the Cu plating layer. The thickness of the Cu plating layer shown in Table 1 below is an average of 10 samples.

TABLE 1

|  | Experimental Example 1 | Experimental Example 2 | Experimental Example 3 | Experimental Example 4 |
| --- | --- | --- | --- | --- |
| Thickness of underlying electrode layer | 2 µm | 4 µm | 8 µm | 4 µm |
| Thickness of Cu plating layer | 8 µm | 6 µm | 2 µm | 6 µm |
| Conductive particles | Cu particles | Cu particles | Cu particles | Ni particles |
| Laser resistance test | 1.66 | 1.38 | 0.69 | 1 |

As is evident from the results shown in Table 1, by setting the thickness of the Cu plating layer to be larger than the thickness of the underlying electrode layer, laser resistance is improved. Furthermore, in the case where the conductive particles contained in the underlying electrode layer are Ni particles, since the thermal conductivity of Ni is lower than the thermal conductivity of Cu, good laser resistance cannot be obtained. In the case where Cu particles are contained in the underlying electrode layer, good laser resistance can be obtained. Furthermore, when Ni particles are used for the underlying electrode layer, in order to secure adhesion strength between the ceramic body and the underlying electrode layer, a ceramic binder may be added into the underlying electrode layer in some cases. However, since the ceramic binder is added, the metal ratio cannot be increased, leading to a further decrease in thermal conductivity, and it is not possible to secure good laser resistance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A ceramic electronic component comprising:
a ceramic body including first and second principal surfaces extending in a length direction and a width direction, first and second lateral surfaces extending in the length direction and a thickness direction, and first and second end surfaces extending in the width direction and the thickness direction; and an outer electrode provided on the first principal surface; wherein the outer electrode includes:

an underlying electrode layer disposed on the first principal surface and including Cu and glass; and a Cu plating layer disposed on the underlying electrode layer; wherein the Cu plating layer is thicker than the underlying electrode layer.

2. The ceramic electronic component according to claim 1, wherein a thickness of the Cu plating layer is about 1.5 times or greater than a thickness of the underlying electrode layer.

3. The ceramic electronic component according to claim 1, further comprising an inner electrode which is exposed at a surface of the ceramic body and which is electrically connected to the outer electrode; wherein the underlying electrode layer includes:

a glass medium; and a plurality of Cu particles which are disposed in the glass medium and which define a conduction path electrically connecting the inner electrode and the Cu plating layer to each other.

4. The ceramic electronic component according to claim 3, wherein the plurality of Cu particles include elongated Cu particles.

5. The ceramic electronic component according to claim 3, wherein a glass content in the underlying electrode layer is about 35% by volume or greater.

6. The ceramic electronic component according to claim 1, wherein a thickness of the outer electrode is about 15 μm or less.

7. The ceramic electronic component according to claim 1, wherein the outer electrode is arranged so as to extend over the first end surface to the first and second principal surfaces and to the first and second lateral surfaces.

8. The ceramic electronic component according to claim 1, wherein the outer electrode includes a first portion disposed on the first principal surface, a second portion disposed on the second principal surface, a third portion disposed on the first end surface, a fourth portion disposed on the first lateral surface, and a fifth portion disposed on the second lateral surface.

9. The ceramic electronic component according to claim 1, wherein the outer electrode extends over the second end surface to the first and second principal surfaces and to the first and second lateral surfaces.

10. The ceramic electronic component according to claim 1, wherein the outer electrode includes a first portion disposed on the first principal surface, a second portion disposed on the second principal surface, a third portion disposed on the second end surface, a fourth portion disposed on the first lateral surface, and a fifth portion disposed on the second lateral surface.

11. The ceramic electronic component according to claim 1, wherein the underlying electrode layer includes a glass medium and a glass content of the underlying electrode layer is about 35% to about 75% by volume.

12. The ceramic electronic component according to claim 1, wherein the underlying electrode layer includes a glass medium and a glass content of the underlying electrode layer is about 35% to about 50% by volume.

13. The ceramic electronic component according to claim 1, wherein the underlying electrode layer includes a glass medium and the glass medium includes at least one network former oxide selected from the group consisting of $B_2O_3$ and $SiO_2$ and at least one network modifier oxide selected from the group consisting of $Al_2O_3$, $ZnO$, $CuO$, $Li_2O$, $Na_2O$, $K_2O$, $MgO$, $CaO$, $BaO$, $ZrO_2$, and $TiO_2$.

14. The ceramic electronic component according to claim 1, wherein the underlying electrode layer includes a glass medium and the glass medium includes about 35 mol % or more of $SiO_2$.

15. The ceramic electronic component according to claim 1, wherein a thickness of a portion of the Cu plating layer located on the first principal surface is larger than a thickness of a portion of the underlying electrode layer located on the first principal surface.

16. The ceramic electronic component according to claim 1, wherein the Cu plating layer is defined by a single Cu plating layer.

17. The ceramic electronic component according to claim 1, wherein the Cu plating layer is defined by a multilayer body including a plurality of Cu plating layers.

18. The ceramic electronic component according to claim 1, wherein the Cu plating layer is directly disposed on the underlying electrode layer so as to be in direct contact with the underlying electrode layer.

19. A wiring board including a built-in ceramic electronic component, the wiring board comprising:

a ceramic electronic component including:

a ceramic body including first and second principal surfaces extending in a length direction and a width direction, first and second lateral surfaces extending in the length direction and a thickness direction, and first and second end surfaces extending in the width direction and the thickness direction; and an outer electrode provided on the first principal surface; wherein the outer electrode includes:

an underlying electrode layer disposed on the first principal surface and including Cu and glass; and a Cu plating layer disposed on the underlying electrode layer; wherein the Cu plating layer is thicker than the underlying electrode layer; and a wiring board in which the ceramic electronic component is embedded; wherein the wiring board includes:

an electrode pad which is provided on a principal surface thereof and opposed to the outer electrode; and a via-hole electrode which electrically connects the electrode pad and the outer electrode to each other.

* * * * *